United States Patent
Moriyama et al.

(10) Patent No.: US 8,951,353 B2
(45) Date of Patent: Feb. 10, 2015

(54) MANUFACTURING METHOD AND APPARATUS FOR SEMICONDUCTOR DEVICE

(75) Inventors: Yoshikazu Moriyama, Izu (JP); Yoshihisa Ohta, Numazu (JP)

(73) Assignee: NuFlare Technology, Inc., Numazu-shi, Shizuoka-ken (JP)

( * ) Notice: Subject to any disclaimer, the term of this patent is extended or adjusted under 35 U.S.C. 154(b) by 506 days.

(21) Appl. No.: 13/221,565

(22) Filed: Aug. 30, 2011

(65) Prior Publication Data

US 2012/0052659 A1 Mar. 1, 2012

(30) Foreign Application Priority Data

Aug. 31, 2010 (JP) ................................. 2010-194323

(51) Int. Cl.
*C23C 16/455* (2006.01)
*C23C 16/458* (2006.01)
(Continued)

(52) U.S. Cl.
CPC ............. *C23C 16/56* (2013.01); *C23C 14/5806* (2013.01); *C23C 14/54* (2013.01); *C23C 14/505* (2013.01); *C23C 14/541* (2013.01); *C23C 16/45504* (2013.01); *C23C 16/45508* (2013.01); *C23C 16/463* (2013.01); *C23C 16/24* (2013.01); *C23C 16/4584* (2013.01); *C23C 16/46* (2013.01); *C30B 25/02* (2013.01);
(Continued)

(58) Field of Classification Search
USPC ...................... 118/715, 723 R, 724, 725, 730; 156/345.1, 345.24, 345.27, 345.29, 156/345.52, 345.53, 345.55; 427/781
See application file for complete search history.

(56) References Cited

U.S. PATENT DOCUMENTS 3,962,716 A * 6/1976 Petroff et al. .................. 257/190
4,813,732 A * 3/1989 Klem ........................... 294/103.1
(Continued)

FOREIGN PATENT DOCUMENTS

JP 11-67675 3/1999
JP 11067675 A * 3/1999
(Continued)

OTHER PUBLICATIONS

Silane Production. Silicon Chemical Corporation (SCC). Bulletin 01292010SCCR7 (2010). Available online on Dec. 30, 2013 at http://www.siliconchemical.com/slicksheetpdfs/silaneproduction7.pdf.*
(Continued)

*Primary Examiner* — Jeffrie R Lund
*Assistant Examiner* — Stanislav Antolin
(74) *Attorney, Agent, or Firm* — Finnegan, Henderson, Farabow, Garrett & Dunner, L.L.P.

(57) ABSTRACT

A manufacturing method for semiconductor device includes: loading a wafer to a reaction chamber and placing the wafer on a support member; supplying process gas including source gas to a surface of the wafer, controlling a heater output and heating the wafer to a predetermined temperature while rotating the wafer at a first rotational speed, and thereby forming a film on a surface of the wafer; stopping supplying the source gas; decreasing a rotational speed of the wafer to a second rotational speed which enables an offset balance of the wafer to be maintained and stopping the heater output; and decreasing a temperature of the wafer while rotating the wafer at the second rotational speed.

10 Claims, 3 Drawing Sheets

(51) Int. Cl.
| | |
|---|---|
| C23C 16/46 | (2006.01) |
| C23C 16/52 | (2006.01) |
| C23C 14/58 | (2006.01) |
| C23C 14/54 | (2006.01) |
| H01L 21/205 | (2006.01) |
| C23C 16/56 | (2006.01) |
| C23C 14/50 | (2006.01) |
| C23C 16/24 | (2006.01) |
| C30B 25/02 | (2006.01) |
| C30B 25/10 | (2006.01) |
| C30B 25/16 | (2006.01) |
| C30B 29/06 | (2006.01) |
| C23C 14/06 | (2006.01) |
| H01L 21/02 | (2006.01) |

(52) U.S. Cl.
CPC .............. *C30B 25/10* (2013.01); *C30B 25/16* (2013.01); *C30B 29/06* (2013.01); *C23C 14/0617* (2013.01); *C23C 14/0635* (2013.01); *C23C 14/0652* (2013.01); *C23C 14/0682* (2013.01); *H01L 21/02532* (2013.01); *H01L 21/02546* (2013.01); *H01L 21/0262* (2013.01)
USPC ........ 118/730; 118/715; 118/725; 156/345.1; 156/345.52; 156/345.53; 156/345.55

(56) References Cited

U.S. PATENT DOCUMENTS

| | | | | |
|---|---|---|---|---|
| 4,821,674 | A * | 4/1989 | deBoer et al. | 118/666 |
| 4,836,138 | A * | 6/1989 | Robinson et al. | 118/666 |
| 4,846,102 | A * | 7/1989 | Ozias | 118/730 |
| 4,975,561 | A * | 12/1990 | Robinson et al. | 219/390 |
| 5,020,475 | A * | 6/1991 | Crabb et al. | 118/719 |
| 5,044,315 | A * | 9/1991 | Ozias | 427/248.1 |
| 5,080,549 | A * | 1/1992 | Goodwin et al. | 414/744.8 |
| 5,091,333 | A * | 2/1992 | Fan et al. | 117/89 |
| 5,156,521 | A * | 10/1992 | Crabb et al. | 414/805 |
| 5,221,556 | A * | 6/1993 | Hawkins et al. | 427/255.17 |
| 5,261,960 | A * | 11/1993 | Ozias | 118/719 |
| 5,365,877 | A * | 11/1994 | Kubota | 117/93 |
| 5,902,407 | A * | 5/1999 | deBoer et al. | 118/725 |
| 5,904,769 | A * | 5/1999 | Ohashi et al. | 117/89 |
| 6,113,705 | A * | 9/2000 | Ohashi et al. | 118/730 |
| 6,126,744 | A * | 10/2000 | Hawkins et al. | 117/85 |
| 6,252,261 | B1 * | 6/2001 | Usui et al. | 257/190 |
| 6,783,592 | B2 * | 8/2004 | Neudeck et al. | 117/97 |
| 7,398,014 | B1 * | 7/2008 | Camm et al. | 392/418 |
| 2002/0017363 | A1 * | 2/2002 | Nakashima et al. | 156/345 |
| 2003/0134492 | A1 * | 7/2003 | Lerch et al. | 438/503 |
| 2007/0204796 | A1 * | 9/2007 | Hirata et al. | 118/715 |
| 2007/0218664 | A1 * | 9/2007 | Ito et al. | 438/565 |
| 2008/0308036 | A1 | 12/2008 | Ito et al. | |
| 2009/0139448 | A1 * | 6/2009 | Hirata et al. | 117/107 |
| 2009/0142933 | A1 * | 6/2009 | Yajima et al. | 438/758 |
| 2010/0006024 | A1 * | 1/2010 | Brabant et al. | 117/104 |
| 2010/0055318 | A1 * | 3/2010 | Volf et al. | 427/255.28 |
| 2010/0055925 | A1 * | 3/2010 | Suzuki et al. | 438/758 |
| 2010/0075509 | A1 * | 3/2010 | Hirata et al. | 438/782 |
| 2012/0272892 | A1 * | 11/2012 | Paranjpe et al. | 117/86 |

FOREIGN PATENT DOCUMENTS

| | | | | |
|---|---|---|---|---|
| JP | 2009-135229 | | 6/2009 | |
| JP | 2009-135230 | | 6/2009 | |
| JP | 2009135229 | A | * | 6/2009 |
| JP | 2009135230 | A | * | 6/2009 |
| JP | 2012054327 | A | * | 3/2012 |

OTHER PUBLICATIONS

D. R. Black et al. X-Ray Topography, National Institute of Standards and Technology, Special Publication 960-10, 53 pages (Apr. 2004), available online on Dec. 29, 2013 at http://www.ceramics.nist.gov/ftproot/xraytop.pdf.*

Conax Semiconductor Products. Thermocouples for ASM Epsilon® Reactors. Bulletin 6041 B. Copyright 2008. Conax Technologies, Buffalo, NY, US. Available Jun. 20, 2014 online at http://boiswood.co.uk/uploads/otherimg/2437.pdf. pp. 1-2.*

Andrew Newman and P.S. Krishnapras. Modeling and Optimization of Epitaxial Growth: Transport and Growth Studies. Technical Report 99-19, Institute for Systems Research. Technical Report 99-2, Center for Dynamics and Control of Smart Structures (CDCSS). 1999. Available Jun. 20, 2014 online at http://www.dtic.mil/dtic/tr/fulltext/u2/a441085.pdf.*

Andrew Newman, P.S. Krishnaprasad, Sam Ponczak, and Paul Brabant. Modeling and Model Reduction for Control and Optimization of Epitaxial Growth in a Commercial RTCVD Reactor. Technical Report 98-45. Institute for Systems Research. 1998. Available Jun. 20, 2014 online at http://www.dtic.mil/dtic/tr/fulltext/u2/a441006.pdf. pp. 1-64.*

* cited by examiner

MANUFACTURING METHOD AND APPARATUS FOR SEMICONDUCTOR DEVICE

CROSS-REFERENCE TO RELATED APPLICATION

This application is based upon and claims the benefit of priority from the prior Japanese Patent Application No. 2010-194323 filed on Aug. 31, 2010, the entire contents of which are incorporated herein by reference.

BACKGROUND

The present invention relates to a manufacturing method and a manufacturing apparatus for semiconductor device for forming a film by, for example, supplying reaction gas to a surface of a semiconductor wafer while heating a back surface.

In recent years, following requirements for reduced cost and higher functions of semiconductor devices, higher productivity and quality are also required in film forming process.

In the film forming process, for example, Japanese Patent Application Laid-Open No. 11-67675 discloses conveying a wafer in a manufacturing apparatus, supplying process gas from above, and rotating the wafer at a high speed of about 900 rpm while heating the wafer by means of a heater to cause epitaxial growth.

Further, after an epitaxial film is formed on the wafer in this way, the rotation speed of the wafer is decreased and a heater output is stopped to decrease the temperature of the wafer to convey the wafer out of the manufacturing apparatus.

SUMMARY

A manufacturing method for semiconductor device according to the present invention includes: loading a wafer to a reaction chamber and placing the wafer on a support member; supplying process gas including source gas to a surface of the wafer, controlling a heater output and heating the wafer to a predetermined temperature while rotating the wafer at a first rotational speed, and thereby forming a film on a surface of the wafer; stopping supplying the source gas; decreasing a rotational speed of the wafer to a second rotational speed which enables an offset balance of the wafer to be maintained and stopping the heater output; and decreasing a temperature of the wafer while rotating the wafer at the second rotational speed.

A manufacturing apparatus for semiconductor device according to the present invention includes: a reaction chamber configured to load a wafer therein; a support member provided in the reaction chamber and configured to place the wafer thereon; a process gas supply mechanism configured to supply process gas to a surface of the wafer; a gas discharge mechanism configured to discharge gas and to control a pressure in the reaction chamber; a rotation driving control mechanism configured to control a rotational speed of the wafer to a first rotational speed when a film is formed, and to a second rotational speed when a temperature of the wafer is decreased; a heater configured to heat the wafer to a predetermined temperature; and a temperature control mechanism configured to control the heater to a predetermined temperature when the process gas including source gas is supplied, to stop a output when stopping supplying the source gas and the rotational speed of the wafer is decreased to the second rotational speed.

DETAILED DESCRIPTION

Reference will now be made in detail to the present embodiment of the invention, an example of which is illustrated in the accompanying drawings.

There is a concern that a wafer is misaligned when the temperature of the wafer is decreased upon high speed rotation, and therefore the rotational speed is generally decreased to about 600 rpm, gas is vented, $H_2$ gas is purged and then the rotational speed is decreased to about 100 rpm to turn off the heater.

However, if the film thickness increases when a pressure resistance of semiconductor elements becomes higher, the wafer is more susceptible to the influence of an offset balance when the temperature is decreased, and there is a problem that slip is generated on the wafer.

The embodiment of the present invention is made in response to this problem.

Hereinafter, an embodiment of the present invention will be described with reference to the drawings.

Figure 1:
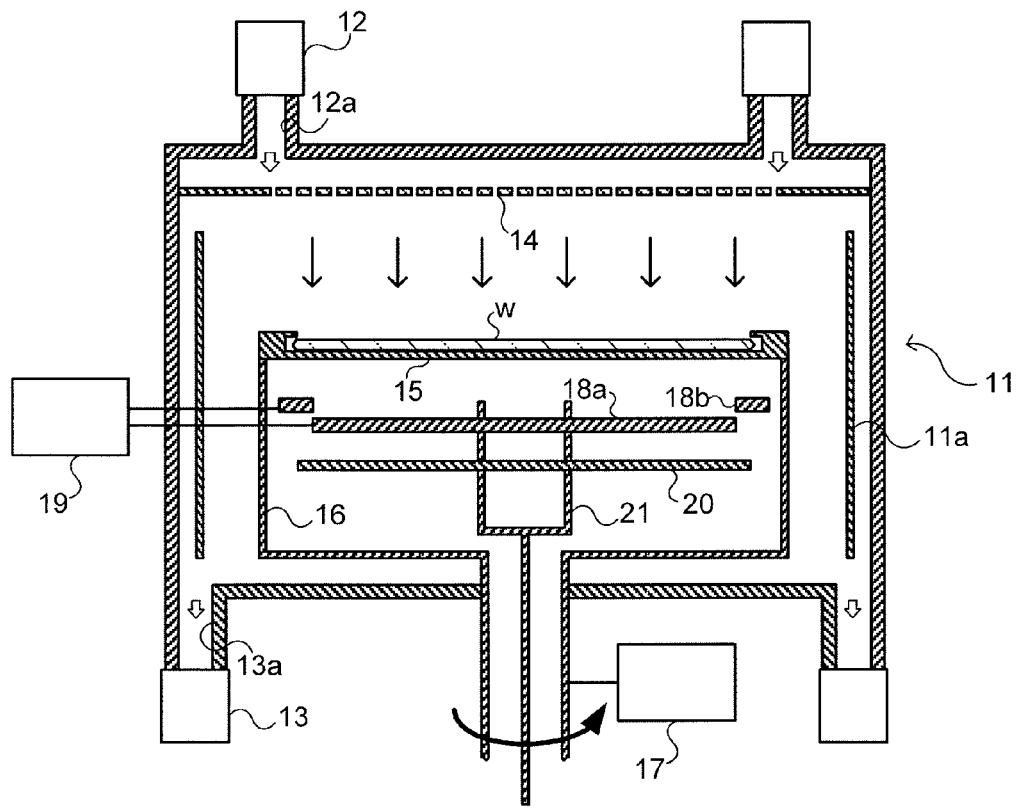
FIG. 1 is a sectional view of an epitaxial growing device used in one embodiment of the present invention.

FIG. 1 is a sectional view of an epitaxial growing device used in the present embodiment. As illustrated in FIG. 1, a reaction chamber 11 in which, for example, a Si wafer w of φ 200 mm is formed has a quartz cover 11a covering an inner wall where necessary.

In the upper part of the reaction chamber 11, gas supply ports 12a are provided which are connected with process gas supply mechanisms 12 which supply process gas including source gas and dilution gas. Further, in the lower part of the reaction chamber 11, gas outlets 13a which are connected with gas discharge mechanisms 13 which discharge gas and control the pressure in the reaction chamber 11 at a constant pressure (normal pressure) are provided at, for example, two portions.

A distribution plate 14 which has fine penetration holes for rectifying and supplying supplied process gas is provided below the gas supply ports 12a.

Further, a susceptor 15 which is made of, for example, SiC and is a support member on which a wafer w is placed is provided below the distribution plate 14. The susceptor 15 is disposed on a ring 16 which is a rotation member. The ring 16 is connected with a rotation driving control mechanism 17 which has, for example, a motor through a rotation axis which rotates the wafer w at a predetermined rotation speed.

Heaters which heat the wafer w and which are composed of an in-heater 18a and an out-heater 18b which are made of, for example, SiC are disposed inside the ring 16, and are respectively connected with a temperature control mechanism 19. Further, a disk-shaped reflector 20 which efficiently heats the wafer w is disposed below these in-heater 18a and out-heater 18b.

Furthermore, a push-up pin 21 is disposed which supports the wafer w from the back surface penetrating the susceptor 15, in-heater 18a and reflector 20, and has, for example, three pins. The push-up pin 21 can place the wafer w on the susceptor 15 by placing the conveyed wafer w above the susceptor 15 and lowering the wafer w.

Using this epitaxial growing device, a Si epitaxial film is formed on the wafer w.

Figure 2:
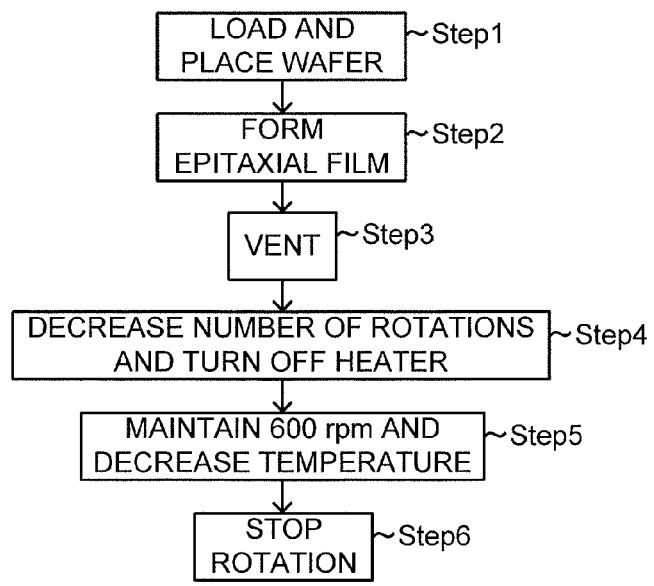
FIG. 2 is a flowchart of a manufacturing method for a semiconductor device according to one embodiment of the present invention.

As illustrated in FIG. 2, the wafer w is first conveyed in the reaction chamber 11 by means of a conveying arm (not illustrated). The wafer w is placed on the susceptor 15 by placing the wafer w on the push-up pin 21 and lowering the wafer w (Step 1).

The temperature control mechanism 19 heats the in-heater 18a and out-heater 18b to predetermined temperatures, respectively to heat the wafer w to, for example, 1140° C., and the rotation driving control mechanism 17 rotates the wafer w at, for example, 900 rpm.

Process gas for which the process gas supply mechanism 12 controls the flow rate and which is mixed is supplied onto the surface of the wafer w in the rectified state through the distribution plate 14. The process gas uses, for example, trichlorosilane as source gas, is diluted to 2.5% by $H_2$ of dilution gas to adjust the concentration, and is supplied at, for example, 50 SLM.

By contrast with this, discharge gas containing extra surplus process gas and HCl including a reaction byproduct is discharged below from the surrounding of the susceptor 15, and is discharged from the gas discharge mechanisms 13 through the gas outlets 13a.

Thus, a Si epitaxial film is grown on the wafer w until the film thickness becomes, for example, 80 pm (Step 2).

The process gas supply mechanisms 12 stop supplying source gas, and source gas in the reaction chamber is discharged (vented) (Step 3). The rotation driving control mechanism 17 decreases the rotational speed at, for example, 20 rpm/sec while supplying $H_2$ as purge gas, and the temperature control mechanism 19 stops outputs of the in-heater 18a and out-heater 18b (Step 4).

Thus, while the rotational speed is decreased to 600 rpm and is maintained, and the temperature of the wafer w is decreased (Step 5). Further, after the temperature of the wafer is decreased to about 800° C., rotation is stopped and the wafer is unloaded (Step 6).

When a slip state of the wafer on which the Si epitaxial film is formed in this way is evaluated by X-Ray Topography (XRT), the maximum slip length is equal to or less than 5 mm, and cumulative slip length is equal to or less than 20 mm. This slip state is substantially improved compared to the maximum slip length 50 mm and cumulative slip length 650 mm in a wafer formed according to a conventional method.

Figure 3:
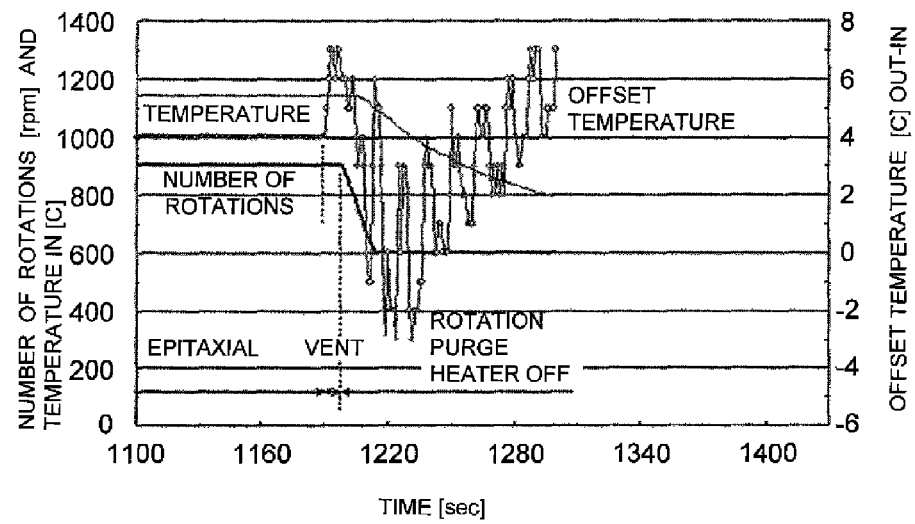
FIG. 3 is a view illustrating temporal changes of a wafer temperature (In) in the center of the wafer, the rotational speed and offset temperature (Out-In) in the outer periphery of the wafer on the basis of the wafer temperature (In) according to one embodiment of the present invention.

Meanwhile, FIG. 3 illustrates temporal changes of a wafer temperature (In) in the center of the wafer, the rotational speed and an offset temperature (Out-In) in the outer periphery of the wafer on the basis of the wafer temperature (In). Although the offset temperature maintains +4° C. which is an optimal value when a film is formed, the offset temperature increased upon vent, decreases when rotation starts decreasing and the heater is turned off, and then increases. Herein, the offset balance means the balance of the offset temperature.

Figure 4:
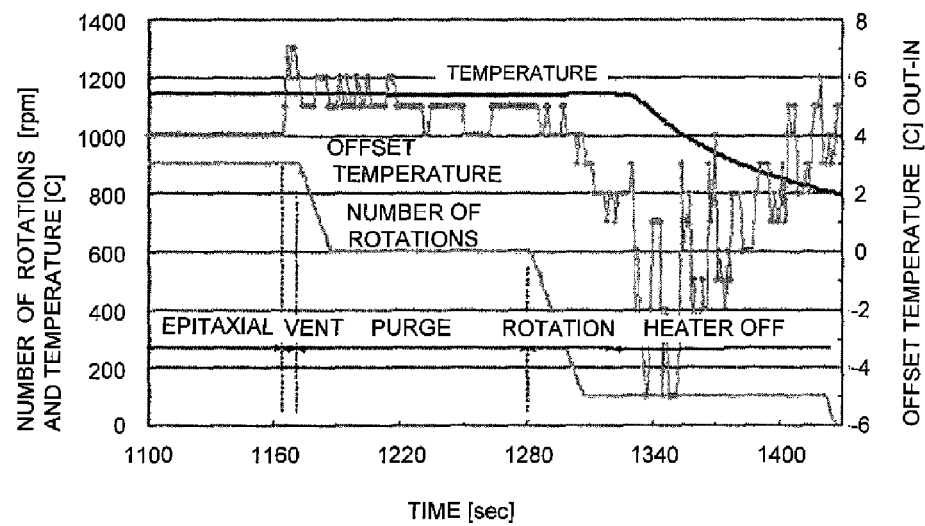
FIG. 4 is a view illustrating temporal changes of a wafer temperature (In) in the center of the wafer, the rotational speed and offset temperature (Out-In) in the outer periphery of the wafer on the basis of the wafer temperature (In) according to a comparison example.

By contrast with this, FIG. 4 illustrates as a comparison example, temporal changes of a wafer temperature (In), the rotational speed and an offset temperature (Out-In) in conventional process in which rotation is decreased, gas is purged, rotation is set to a low speed and the heaters are turned off. Compared to the present embodiment illustrated in FIG. 3, while the change of the temperature in the center of the wafer is the same, the temperature in the outer periphery immediately after the heaters are turned off decreases significantly, and the offset balance is significantly collapsed.

Figure 5:
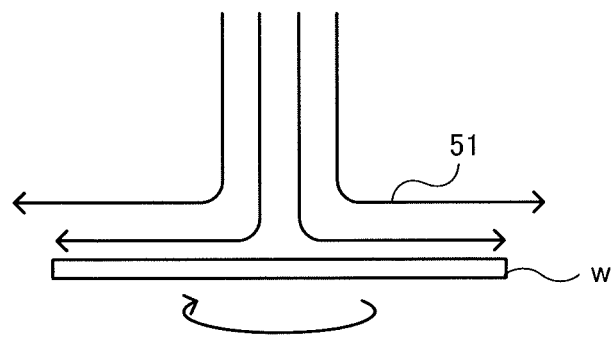
FIG. 5 is a schematic view illustrating a gas flow upon high speed rotation.
Figure 6:
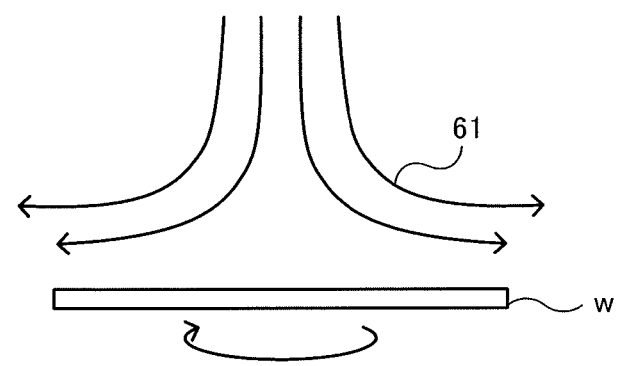
FIG. 6 is a schematic view illustrating a gas flow upon low speed rotation.

This is for the following reason. In case of high speed rotation (for example, 600 rpm), as illustrated as a schematic view in FIG. 5, purge gas 51 is attracted to the wafer w, is placed in the laminar flow state on the wafer w and is discharged from a peripheral part, so that a temperature distribution becomes uniform and, consequently, the offset balance is maintained. However, in case of low speed rotation (for example, 100 rpm), as illustrated as a schematic view in FIG. 6, purge gas 61 is discharged below from a peripheral part without being attracted to the wafer w, and therefore the temperature in the peripheral part decreases (the offset temperature decreases).

In addition, although the rotational speed which enables the offset balance to be maintained in this way fluctuates depending on, for example, the diameter of the wafer and film forming temperature, the rotational speed may be roughly 50% or more of the rotations upon film formation.

By contrast with this, upon high speed rotation, the change of the temperature significantly influences the offset balance, and the wafer is more likely to be misaligned. Hence, by decreasing the rotational speed in a range which enables the offset balance to be maintained and turning off the heaters, it is possible to suppress the influence on the offset balance. In this case, the rotational speed decreases to some degree until the temperature actually decreases after the heaters are turned off, so that the heaters may be turned off at the same timing when the rotational speed starts decreasing.

Further, by maintaining the rotational speed (for example, 600 rpm) which enables the offset balance to be maintained until at least 100° C. decreases (to, for example, 800° C.), and decreasing the temperature, it is possible to decrease the temperature of the wafer without collapsing the offset balance.

According to the present embodiment, it is possible to decrease the temperature of the wafer without collapsing the offset balance and, consequently, prevent the wafer from slip generation and stably form, for example, a quality epitaxial film on a wafer productively.

Further, it is possible to improve the yield rate of wafers, improve the yield rate of semiconductor devices formed through element forming process and element separating process and improve reliability such as stability of element characteristics. By applying the present embodiment to epitaxial forming process of power semiconductor devices such as power MOSFET and IGBT in which films having the thickness equal to or more than 40 μm need to be grown in an N-type base area, P-type base area and insulation separation area in particular, it is possible to provide good element characteristics.

Further, although a case has been described with the present embodiment where a Si single crystal layer (epitaxial film) is formed, the present embodiment is applicable to form a poly Si layer and SiC single crystal layer. Further, the present embodiment is also applicable to form, for example, films other than $SiO_2$ film, $Si_3N_4$ film, and Si film, or is applicable to a GaAs layer or compound semiconductors such as GaAlAs and InGaAs. The present embodiment can be variously modified and implemented in a range which does not deviate from the scope of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for semiconductor device comprising:
    a reaction chamber configured to load a wafer therein;
    a support member provided in the reaction chamber and configured to place the wafer thereon;
    a process gas supply mechanism configured to supply process gas including a source gas to a surface of the wafer during a film formation on the wafer and to supply a purge gas to the surface of the wafer after the film formation;
    a gas discharge mechanism configured to discharge gas, to control a pressure in the reaction chamber, and to vent the source gas after the film formation;
    a rotation driving control mechanism configured to control a rotational speed of the wafer to a predetermined first rotational speed during the film formation, and to a second rotational speed which is equal to or more than 50% of the first rotational speed and is decreased from the first rotational speed and is maintained after the film formation;
    a heater configured to heat the wafer to a predetermined temperature; and
    a temperature control mechanism configured to control an output of the heater to a predetermined temperature during the film formation, and to turn off the heater output when the rotational speed of the wafer is decreased from the first rotational speed to the second rotational speed and a process for decreasing the temperature of the wafer is started after the film formation.

2. The manufacturing apparatus for semiconductor device according to claim 1, wherein the rotation driving control mechanism rotates the wafer at the second rotational speed until at least 100° C. decreases from the predetermined temperature.

3. The manufacturing method for semiconductor device according to claim 1, wherein the rotation driving control mechanism rotates the wafer at the second rotational speed until the temperature of the wafer becomes 800° C.

4. The manufacturing apparatus for semiconductor device according to claim 1, wherein the gas discharge mechanism stops supplying the source gas from the process gas supply mechanism, and then vents the source gas in the reaction chamber.

5. The manufacturing apparatus for semiconductor device according to claim 1, wherein the rotation driving control mechanism decreases the rotational speed of the wafer after the source gas is vented.

6. The manufacturing apparatus for semiconductor device according to claim 1, wherein the process gas supply mechanism supplies $H_2$ gas when the temperature of the wafer is decreased.

7. The manufacturing apparatus for semiconductor device according to claim 1, wherein the second rotational speed enables a predetermined offset balance of the wafer to be maintained.

8. The manufacturing apparatus for semiconductor device according to claim 1, wherein the film equal to or more than 40 μm is formed on the wafer.

9. The manufacturing apparatus for semiconductor device according to claim 1, wherein the temperature control mechanism stops the heater output at a same time when the rotational speed of the wafer starts decreasing.

10. The manufacturing apparatus for semiconductor device according to claim 1, wherein the source gas comprises trichlorosilane.

* * * * *